(12) United States Patent
Nagase et al.

(10) Patent No.: US 8,698,194 B2
(45) Date of Patent: Apr. 15, 2014

(54) SEMICONDUCTOR INTEGRATED CIRCUIT WITH HIGH WITHSTAND VOLTAGE ELEMENT FORMING TRENCH ISOLATION ON SUBSTRATE

(75) Inventors: Takuo Nagase, Higashiura (JP); Junichi Sakano, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/187,552

(22) Filed: Jul. 21, 2011

(65) Prior Publication Data

US 2012/0018776 A1 Jan. 26, 2012

(30) Foreign Application Priority Data

Jul. 21, 2010 (JP) ................................. 2010-164065

(51) Int. Cl.
*H01L 29/66* (2006.01)
*H01L 21/70* (2006.01)
*H01L 27/12* (2006.01)

(52) U.S. Cl.
USPC ........... 257/139; 257/337; 257/347; 257/501; 257/510; 257/E29.197; 257/E29.255; 257/E29.261; 257/E29.327

(58) Field of Classification Search
USPC ................. 257/139, 347, 401, 500, 501, 510, 257/E29.255, E29.661, E29.261, E29.337, 257/E29.197
See application file for complete search history.

(56) References Cited

U.S. PATENT DOCUMENTS 6,150,697 A * 11/2000 Teshigahara et al. ......... 257/347
6,439,514 B1 8/2002 Yamaguchi et al.
7,538,407 B2 * 5/2009 Taki et al. ..................... 257/492
2005/0189648 A1 * 9/2005 Shirokoshi et al. ........... 257/724
2008/0073731 A1 * 3/2008 Hayashi ........................ 257/409
2011/0006351 A1 * 1/2011 Kunii et al. ................... 257/296

FOREIGN PATENT DOCUMENTS

| JP | 11-251597 | 9/1999 |
|---|---|---|
| JP | 11-345977 | 12/1999 |
| JP | 2000-223665 | 8/2000 |
| JP | 3189456 | 5/2001 |
| JP | 2001-345377 | 12/2001 |
| JP | 2005-123512 | 5/2005 |
| JP | 2006-081647 | 3/2006 |
| JP | 2006-165357 | 6/2006 |
| JP | 2010-056212 | 3/2010 |

OTHER PUBLICATIONS

Japanese Office Action dated Jan. 7, 2014; Application No. JP2010-164065; 5 pages.

* cited by examiner

*Primary Examiner* — Wensing Kuo
*Assistant Examiner* — Moazzam Hossain
(74) *Attorney, Agent, or Firm* — Antonelli, Terry, Stout & Kraus, LLP.

(57) ABSTRACT

A first annular isolation trench is formed in a periphery of an element region, and a second annular isolation trench is formed around the first annular isolation trench with a predetermined distance provided from the first annular isolation trench, and a semiconductor layer between the first annular isolation trench and the second annular isolation trench is separated into a plurality of portions by a plurality of linear isolation trenches formed in the semiconductor layer between the first annular isolation trench and the second annular isolation trench, and the semiconductor layer (source-side isolation region) which opposes a p-type channel layer end portion and is located between the first annular isolation trench and the second annular isolation trench is separated from other semiconductor layers (drain-side isolation regions) by the linear isolation trenches.

7 Claims, 7 Drawing Sheets

SEMICONDUCTOR INTEGRATED CIRCUIT WITH HIGH WITHSTAND VOLTAGE ELEMENT FORMING TRENCH ISOLATION ON SUBSTRATE

CROSS-REFERENCE TO RELATED APPLICATION

The present application claims priority from Japanese Patent Application No. 2010-164065 filed on Jul. 21, 2010, the content of which is hereby incorporated by reference to this application.

TECHNICAL FIELD OF THE INVENTION

The present invention relates to a semiconductor integrated circuit, and more particularly integrated circuit having a high withstand voltage semiconductor element formed on a main surface of an SOI (Silicon On Insulator) substrate.

BACKGROUND OF THE INVENTION

In recent years, in a semiconductor integrated circuit in which a high withstand voltage element and a low withstand voltage element are formed on a main surface of an SOI substrate, a dielectric isolation method that combines an SOI substrate and a trench isolation has been used. This dielectric isolation method can shorten an insulation isolation distance between the elements as compared with a junction isolation method, and therefore, it has the advantage of being able to enhance the integration degree of the semiconductor integrated circuit. Moreover, this dielectric isolation method can remove parasitic transistors between the elements in principle, and as a result, malfunction such as latch-up or the like can be prevented and reliability of the semiconductor integrated circuit can be improved.

For example, Japanese Patent No. 3189456 (Patent Document 1) discloses an SOI semiconductor device using a dielectric isolation substrate. In this SOI semiconductor device, an isolation trench is formed to reach a semiconductor supporting substrate through a silicon oxide film from a front surface side of a semiconductor layer, and a polycrystalline semiconductor layer filled in the isolation trench is conductively connected to the semiconductor substrate. Also, to a rear surface of the semiconductor supporting substrate, a filling-layer-potential specifying electrode for applying a predetermined potential to the polycrystalline semiconductor layer through the semiconductor supporting substrate is conductively connected.

SUMMARY OF THE INVENTION

In the dielectric isolation method, each element is formed in an element region of the semiconductor layer constituting an SOI substrate. This element region is surrounded by a dielectric (for example, an insulating film such as a silicon oxide film) constituting the SOI substrate and a dielectric (for example, an insulating film such as a silicon oxide film) buried in the isolation trench formed in the semiconductor layer constituting the SOI substrate. More specifically, each element is formed in the island-shaped element regions of the semiconductor layer constituting the SOI substrate, which are mutually isolated from each other by the dielectric. Moreover, the semiconductor layer (peripheral region) constituting the SOI substrate outside the isolation trench that surrounds each element and the supporting substrate constituting the SOI substrate are fixed to a reference potential in order to stabilize the operation of each element.

Incidentally, in the semiconductor integrated circuit including the high withstand voltage element (for example, the element having an operation voltage of about 200 to 300 V) and the low withstand voltage element (for example, the element having an operation voltage of about 5 V), the reduction in cost and the reduction in electric power consumption by means of the reduction in a semiconductor chip area are imperative. Therefore, it is necessary to improve the output current density of the high withstand voltage element, which occupies a relatively large area in the semiconductor chip and has high electric power consumption.

The inventors of the present invention has been examining the adoption of a high withstand voltage field-effect transistor as a high withstand voltage output-stage element. As a result, by reducing a channel layer of the high withstand voltage field-effect transistor and shortening a channel length, the channel resistance can be lowered, and thus, the output current density can be improved.

However, when the channel layer of the high withstand voltage field-effect transistor is reduced, the electric field intensity of the channel layer near the isolation trench is further increased due to the influence of the potential applied to the peripheral region. Hence, there arises a problem that the withstand voltage in an off time between the source electrode and the drain electrode of the high withstand voltage field-effect transistor is reduced.

An object of the present invention is to provide a technique capable of preventing the reduction in withstand voltage of a high withstand voltage element due to the influence of the potential in a peripheral region and improving the output current density in a semiconductor integrated circuit having a high withstand voltage element formed in an island-shaped semiconductor layer surrounded by a dielectric on a main surface of an SOI substrate.

The above and other objects and novel characteristics of the present invention will be apparent from the description of the present specification and the accompanying drawings.

The following is a brief description of an embodiment of the typical invention disclosed in the present application.

The present embodiment is a high withstand voltage field-effect transistor formed on a main surface of an SOI substrate, in which a first annular isolation trench is formed around an element region of a semiconductor layer in which a field-effect transistor is formed, a second annular isolation trench is formed around the first annular isolation trench with a predetermined distance provided from the first annular isolation trench, the semiconductor layer between the first annular isolation trench and the second annular isolation trench is separated into a plurality of portions by a plurality of linear isolation trenches formed in the semiconductor layer between the first annular isolation trench and the second annular isolation trench, and the semiconductor layer which opposes an end portion of a channel layer of the field-effect transistor and is located between the first annular isolation trench and the second annular isolation trench is isolated from the other semiconductor layers by the linear isolation trenches.

The effects obtained by typical embodiments of the invention disclosed in the present application will be briefly described below.

In a semiconductor integrated circuit having a high withstand voltage element formed on an island-shaped semiconductor layer surrounded by a dielectric on the main surface of an SOI substrate, the reduction in withstand voltage of the high withstand voltage element due to the influence of a potential in a peripheral region is prevented, and thus the output current density can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in some drawings used in the following embodiments, hatching is used even in a plan view so as to make the drawings easy to see. Furthermore, in the following embodiments, a MOSFET (Metal Oxide Semiconductor Field Effect Transistor) representing a field effect transistor is abbreviated to MOS, a p channel MOSFET is abbreviated to pMOS, and an n channel MOSFET is abbreviated to nMOS.

Also, components having the same function are denoted by the same reference symbols throughout the drawings for describing the embodiments in principle, and the repetitive description thereof will be omitted. Hereinafter, embodiments of the present invention will be described in detail with reference to the accompanying drawings.

First, the operation of a high withstand voltage MOSFET having a lateral structure studied by the inventors of the present invention so far will be briefly described below because it seems that the effect of the high withstand voltage MOSFET according to the embodiments of the present invention is clarified.

Figure 1:
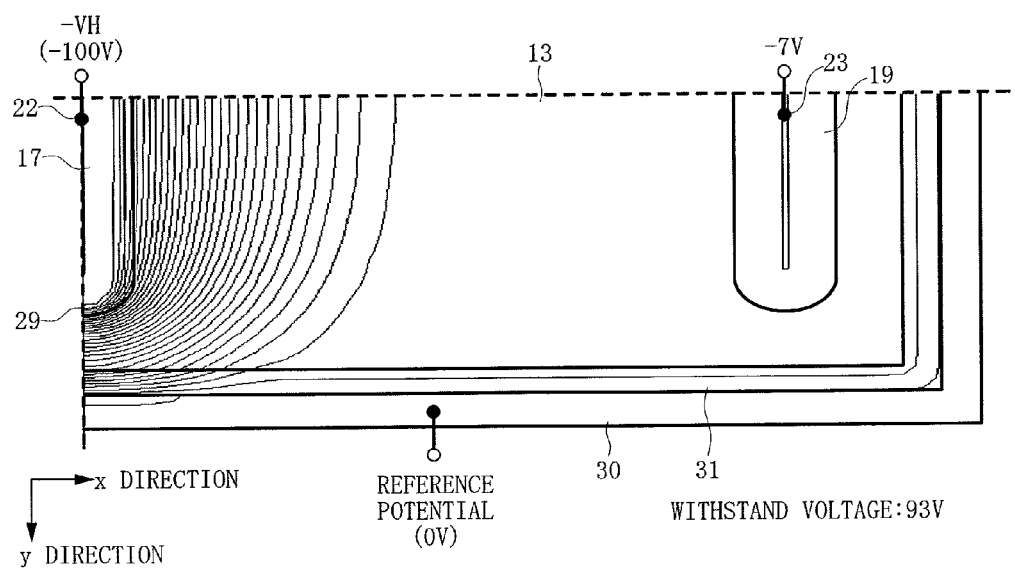
FIG. 1 is a view for describing a simulation result of an equipotential line distribution at the time of avalanche of a high withstand voltage nMOS studied by the inventors of the present invention.

FIG. 1 is a view for describing a simulation result of an equipotential line distribution at the time of avalanche of a high withstand voltage nMOS studied by the inventors of the present invention.

The high withstand voltage nMOS is operated under a predetermined operating condition. For example, a peripheral region 30 is fixed to a reference potential, and −VH voltage (for example, −100 V) is applied to a source electrode 22. In this state, a potential (for example, −7 V) that becomes positive with respect to the source electrode 22 is applied to a drain electrode 23.

At this time, as shown in FIG. 1, in the high withstand voltage nMOS, a depletion layer spreads from a joint portion between a p-type channel layer 17 and an n⁻-type drift layer 13. Then, an avalanche occurs at the point of time when electric field intensity in the high withstand voltage nMOS exceeds critical electric field intensity, and current flows between the source electrode 22 and the drain electrode 23. When the current flows between the source electrode 22 and the drain electrode 23, a voltage applied to the high withstand voltage nMOS becomes withstand voltage of the high withstand voltage nMOS.

In a p-type channel layer end portion 29, the depletion layer spreads toward an n-type drain layer 19 (x direction shown in FIG. 1) and toward an annular isolation trench 31 (y direction shown in FIG. 1), and the electric field is concentrated on the p-type channel layer 17 side to increase the electric field intensity.

When the p-type channel layer 17 is reduced, since a radius of curvature of a corner of the p-type channel layer end portion 29 is reduced, the electric field intensity is further increased. Hence, an avalanche occurs at the p-type channel layer end portion 29 before the equipotential lines expand to the drain region side, and the withstand voltage of the high withstand voltage nMOS is reduced due to the influence of the potential of the peripheral region 30.

Moreover, when the p-type channel layer 17 is reduced, a depth of the p-type channel layer 17 (thickness direction of the semiconductor layer) becomes shallow in general. In this case, the p-type channel layer end portion 29 is further increased in electric field intensity due to a three-dimensional electric field concentration effect.

The method for reducing the influence of the potential of the peripheral region 30 includes, for example, a method of controlling the potential of the peripheral region 30 including the supporting substrate as disclosed in Patent Document 1 (Japanese Patent No. 3189456). However, when the potential of the peripheral region 30 is changed to the potential of the source electrode 22 from the reference potential by using the method described above in order to alleviate the electric field intensity of the p-type channel layer end portion 29, a potential difference between the drain electrode 23 and the peripheral region 30 expands. Thus, the electric field intensity is increased on the drain region side, and the withstand voltage in an OFF time is reduced. In addition, a power source for controlling the potential of the peripheral region 30 is required. There is also concern about the influence to the characteristics of each low voltage element that operates near the reference potential or the malfunction of the circuit due to noise of the power source and the like.

(First Embodiment)

Figure 2:
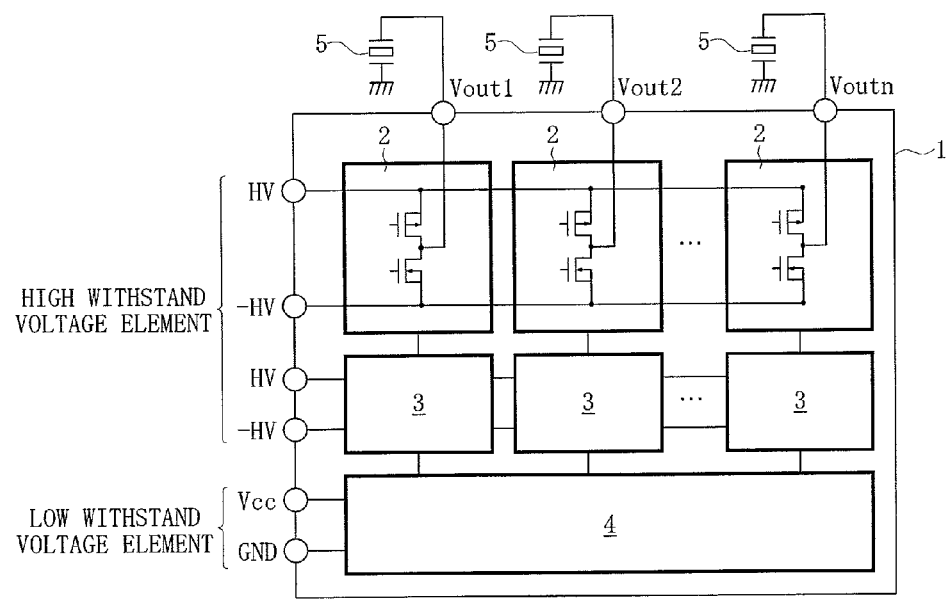
FIG. 2 is a circuit block diagram of a transmission circuit of a semiconductor integrated circuit (ultrasonic diagnostic device) according to a first embodiment of the present invention.

FIG. 2 shows a circuit block diagram of a semiconductor integrated circuit according to a first embodiment. FIG. 2 illustrates an ultrasonic diagnostic device as an example of the semiconductor integrated circuit, and a circuit block diagram of a transmission circuit thereof is shown.

As shown in FIG. 2, a transmission circuit 1 of the ultrasonic diagnostic device is mainly made up of driver circuits 2, level conversion circuits 3, and a logic circuit 4. The driver circuit 2 is driven by alternately applying negative and positive voltages with respect to a reference potential, that is, a VH voltage and a –VH voltage to an ultrasonic vibrator 5. The driver circuit 2 and the level conversion circuit 3 are high voltage circuits made up of a plurality of high withstand voltage elements, that is, high withstand voltage pMOSs, high withstand voltage nMOSs and the like. Also, the logic circuit 4 is a low voltage circuit made up of a plurality of low withstand voltage elements, that is, low withstand voltage pMOSs, low withstand voltage nMOSs and the like. Each element is formed in an island-shaped element region surrounded by an isolation trench in the semiconductor layer constituting an SOI substrate, and a peripheral region in the semiconductor layer constituting the SOI substrate outside of the isolation trench and a supporting substrate constituting the SOI substrate are fixed to the reference potential.

Figure 3:
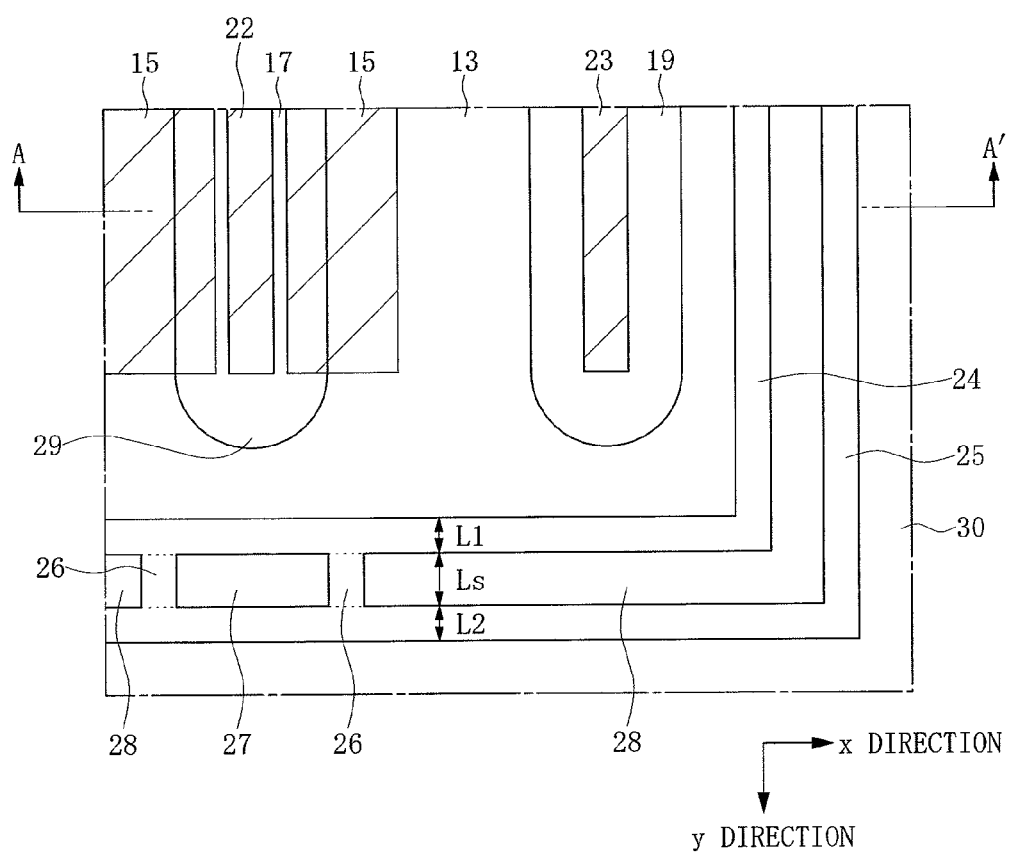
FIG. 3 is a main-part plan view showing a part of a structure of a high withstand voltage nMOS according to the first embodiment of the present invention.
Figure 4:
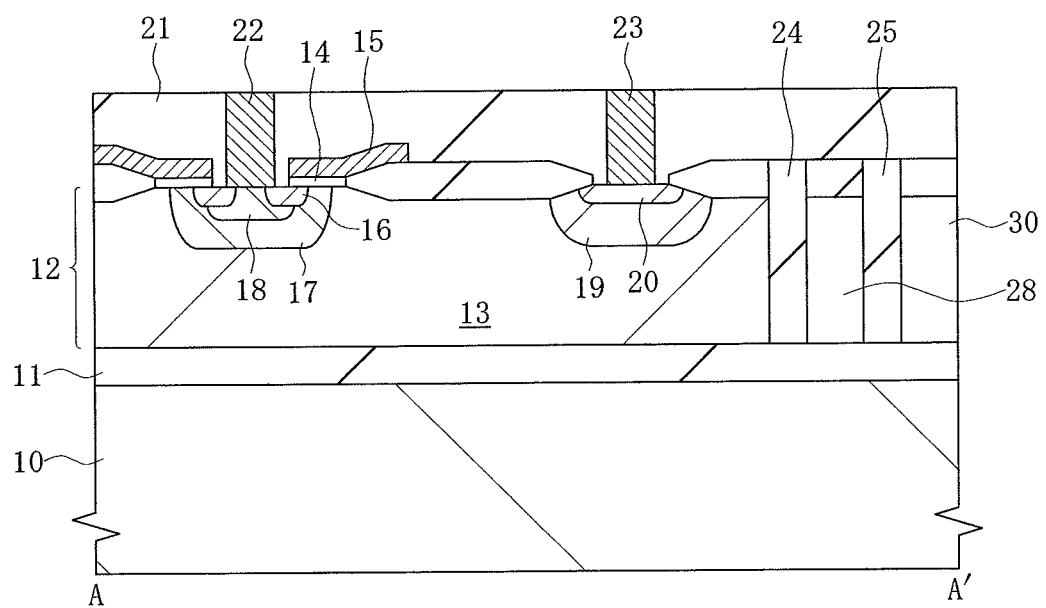
FIG. 4 is a main-part cross-sectional view along the line A-A' of FIG. 3.

Next, the structure of the high withstand voltage element according to the first embodiment will be described with reference to FIGS. 3 and 4. FIG. 3 is a main-part plan view of the region of a part of the high withstand voltage nMOS having a lateral structure, and FIG. 4 is a main-part cross-sectional view along the line A-A' of FIG. 3. FIG. 3 shows the region of a part of the high withstand voltage nMOS, in which the width of the high withstand voltage nMOS in a first direction (y direction shown in FIG. 3: channel width direction) is, for example, approximately 1 mm, and the width in a second direction (x direction shown in FIG. 3: channel length direction) orthogonal to the first direction (y direction) is, for example, approximately 0.1 mm. The high withstand voltage nMOS is, for example, a high withstand voltage element for 200 to 300 V.

As shown in FIGS. 3 and 4, the high withstand voltage nMOS is formed on the SOI substrate. The SOI substrate is made up of a supporting substrate 10 made of single crystal silicon, a buried insulating film (dielectric) 11 formed on the supporting substrate 10, and a semiconductor layer 12 made of single crystal silicon formed on the buried insulating film 11. In the semiconductor layer 12 of the element region in which the high withstand voltage nMOS is formed, an n-type impurity such as phosphorus (p) or arsenic (As) is introduced, and an n⁻-type drift layer 13 is formed. An impurity concentration of the n⁻-type drift layer 13 is, for example, approximately $1 \times 10^{15}$ cm$^{-3}$.

The high withstand voltage nMOS has a source region in the semiconductor layer 12. A gate insulating film 14 is formed on a main surface of the semiconductor layer 12 of the source region. This gate insulating film 14 is composed of, for example, a silicon oxide film. On the gate insulating film 14, a gate electrode 15 which has a rectangular shape and extends in the first direction (y direction) when viewed in plan is formed. This gate electrode 15 is made of, for example, polycrystalline silicon.

A LOCOS (Local Oxidation of Silicon) insulating film is formed on the main surface of the semiconductor layer 12 so as to surround the source region, and an end portion of the gate electrode 15 rides on this LOCOS insulating film. The thickness of this LOCOS insulating film is, for example, approximately 70 to 200 nm. With the structure in which the gate electrode 15 is lifted using the LOCOS insulating film in this manner, an electric field between the gate electrode 15 and the n⁻-type drift layer 13 (or the n-type drain layer 19 to be described later) can be relaxed.

Also, an n-type source layer 16 is formed in the source region. An n-type impurity such as P or As is introduced into the n-type source layer 16, and its impurity concentration is, for example, approximately $1 \times 10^{20}$ cm$^{-3}$. Also, the n-type source layer 16 is surrounded by the p-type channel layer 17. A p-type impurity such as boron (B) is introduced into the p-type channel layer 17, and its impurity concentration is, for example, approximately $1 \times 10^{17}$ cm$^{-3}$. This p-type channel layer 17 is formed also in the region of a part of the semiconductor layer 12 below the gate insulating film 14.

A p-type contact layer 18 is formed at a center portion of the source region. This p-type contact layer 18 is in contact with a part of the n-type source layer 16. A p-type impurity such as B is introduced into the p-type contact layer 18, and its impurity concentration is, for example, approximately $1 \times 10^{17}$ cm$^{-3}$. By providing this p-type contact layer 18, the fixing of the potential of the p-type channel layer 17 can be strengthened, and the reduction in the on-withstand voltage due to the action of parasitic npn (the n-type source layer 16/the p-type chancel layer 17/the n⁻-type drift layer 13) can be prevented.

The high withstand voltage nMOS has a drain region in the semiconductor layer 12. The n-type drain layer 19 is formed in the drain region. An n-type impurity such as P or As is introduced into the n-type drain layer 19, and its impurity concentration is, for example, approximately $1 \times 10^{17}$ cm$^{-3}$.

An n-type contact layer 20 is formed at a center portion of the drain region (surface of the n-type drain layer 19). An n-type impurity such as P or As is introduced into the n-type contact layer 20, and its impurity concentration is, for example, approximately $1 \times 10^{20}$ cm$^{-3}$.

The LOCOS insulating film is formed on the main surface of the semiconductor layer 12 so as to surround the drain region similarly to the source region.

The high withstand voltage nMOS is covered with an interlayer insulating film 21. A rectangular connecting hole which reaches the n-type source layer 16 and the p-type contact layer 18 of the source region and extends in the first direction (y direction) when viewed in plan and a rectangular connecting hole which reaches the n-type contact layer 20 of the drain region and extends in the first direction (y direction) when viewed in plan are formed in this interlayer insulating film 21.

Furthermore, conductors are buried in these connecting holes, whereby the source electrode 22 electrically connected to the n-type source layer 16 and the p-type contact layer 18 of the source region and the drain electrode 23 electrically connected to the n-type contact layer 20 of the drain region are formed. Therefore, the source electrode 22 extends in the first direction (y direction) when viewed in plan, and the drain electrode 23 extends in the first direction (y direction) with a predetermined distance from the source electrode 22 in the second direction (x direction) when viewed in plan. The gate electrode 15, the LOCOS insulating film and the like are formed between the source electrode 22 and the drain electrode 23.

The periphery of the semiconductor layer 12 having the high withstand voltage nMOS formed therein is surrounded by a first annular isolation trench 24 and a second annular isolation trench 25 that is formed outside the first annular isolation trench 24 with a predetermined distance (Ls) from the first annular isolation trench 24 when viewed in plan. The bottom of the first annular isolation trench 24 reaches the buried insulating film 11 constituting the SOI substrate, and an insulating film (for example, silicon oxide film) is buried in the first annular isolation trench 24. The width (L1) of the first annular isolation trench 24 is, for example, 1 µm. Similarly, the bottom of the second annular isolation trench 25 reaches the buried insulating film 11 constituting the SOI substrate, and an insulating film (for example, silicon oxide film) is buried in the second annular isolation trench 25. The width (L2) of the second annular isolation trench 25 is, for example, 1 µm. The distance (Ls) between the first annular isolation trench 24 and the second annular isolation trench 25 is, for example, 1 µm.

Also, four linear isolation trenches 26 that are coupled with the first annular isolation trench 24 and the second annular isolation trench 25 are formed in the semiconductor layer 12 between the first annular isolation trench 24 and the second annular isolation trench 25, and by these four linear isolation trenches 26, the semiconductor layer 12 between the first annular isolation trench 24 and the second annular isolation trench 25 is separated into two source-side isolation regions 27 and two drain-side isolation regions 28.

More specifically, the semiconductor layer 12 which opposes the p-type channel layer end portion 29 in the first direction (y direction) and is located between the first annular isolation trench 24 and the second annular isolation trench 25 is surrounded by two linear isolation trenches 26, and this region is defined as the source-side isolation region 27 and a region other than this region is defined as the drain-side isolation region 28. The bottom of the linear isolation trench 26 reaches the buried insulating film 11 constituting the SOI substrate, and an insulating film (for example, silicon oxide film) is buried in the linear isolation trench 26.

Note that, since FIG. 3 shows the region of a part of the high withstand voltage nMOS, only two linear isolation trenches 26 are illustrated. However, in reality, since the first annular isolation trench 24 and the second annular isolation trench 25 are formed around the high withstand voltage nMOS, there are two p-type channel layer end portions 29 in the first direction (y direction) and there are two portions of the first annular isolation trench 24 and the second annular isolation trench 25 which oppose the respective p-type channel layer end portions 29. In each of these two portions, there is the source-side isolation region 27 surrounded by two linear isolation trenches 26. Consequently, a total of four linear isolation trenches 26 are formed, and a total of two source side isolation trenches 27 are formed.

By diving the semiconductor layer 12 between the first annular isolation trench 24 and the second annular isolation trench 25 into the source-side isolation regions 27 and the drain-side isolation regions 28 by the linear isolation trenches 26 in the above-described manner, the source-side isolation regions 27 and the drain-side isolation regions 28 can be made to have different potential values from each other.

For example, the source-side isolation region 27 is brought into a floating state, and its potential takes a value obtained by sharing the reference potential of the peripheral region 30 and −VH voltage applied to the source electrode 22 based on capacitance and is controlled to a voltage lower than the reference potential. As a result, the electric field intensity near the p-type channel layer end portion 29 that opposes the first annular isolation trench 24 in the first direction (y direction) can be relaxed on the source region side.

On the other hand, the potential of the drain-side isolation region 28 takes a value obtained by sharing the reference potential of the peripheral region 30 and the VH voltage applied to the drain electrode 23 based on capacitance and is controlled to a voltage higher than the reference potential. As a result, the electric field intensity of the n-type drain layer 19 that opposes the first annular isolation trench 24 can be relaxed on the drain region side.

When no linear isolation trench 26 is provided, the semiconductor layer 12 between the first annular isolation trench 24 and the second annular isolation trench 25 comes to have a uniform potential, and it is not possible to relax the electric field intensity of both the source region side and the drain region side.

Figure 5:
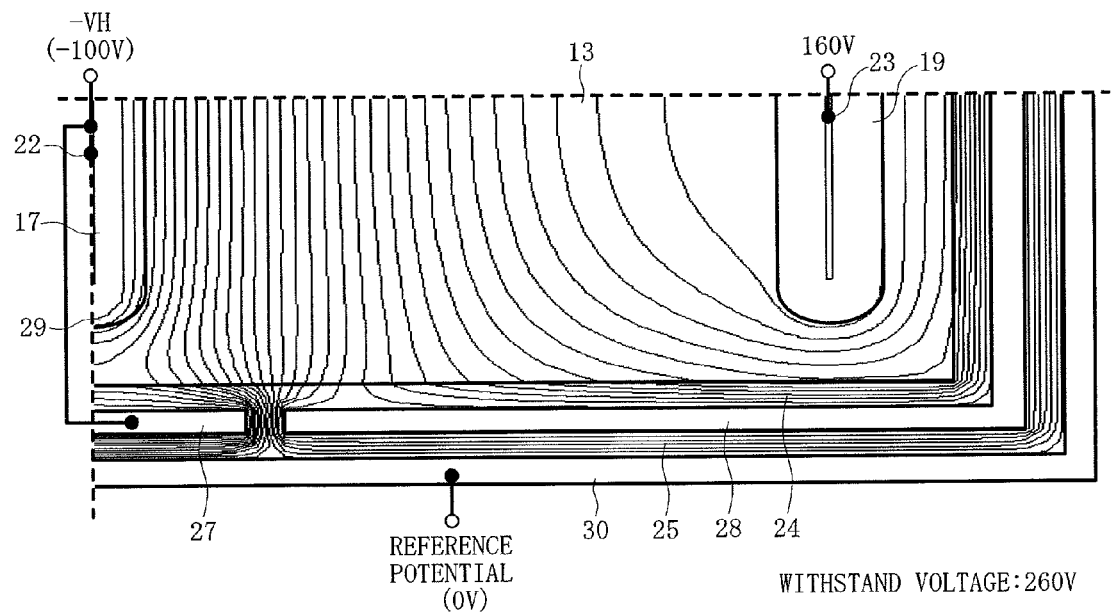
FIG. 5 is a view for describing a simulation result of an equipotential line distribution at the time of avalanche of the high withstand voltage nMOS according to the first embodiment of the present invention.

FIG. 5 shows a view for describing a simulation result of an equipotential line distribution at the time of avalanche of the high withstand voltage nMOS in which the semiconductor layer 12 between the first annular isolation trench 24 and the second annular isolation trench 25 is divided into the source-side isolation region 27 and the drain-side isolation region 28 by the linear isolation trenches 26.

As shown in FIG. 5, in the high withstand voltage nMOS in which the semiconductor layer 12 is divided into the source-side isolation region 27 and the drain-side isolation region 28, the density of equipotential lines near the p-type channel layer end portion 29 is reduced and a radius of curvature is increased as compared with the high withstand voltage nMOS in which the semiconductor layer 12 is not divided into the source-side isolation region 27 and the drain-side isolation region 28 (see the above-described FIG. 1). Consequently, the electric field intensity is relaxed, and the equipotential lines spread to the drain region side.

In the first embodiment, the semiconductor layer 12 between the first annular isolation trench 24 and the second annular isolation trench 25 is divided into two source-side isolation regions 27 and two drain-side isolation regions 28 by four linear isolation trenches 26. Alternatively, it is also possible to separate the drain-side isolation regions 28 into a plurality of portions by a plurality of linear isolation trenches 26.

Figure 6:
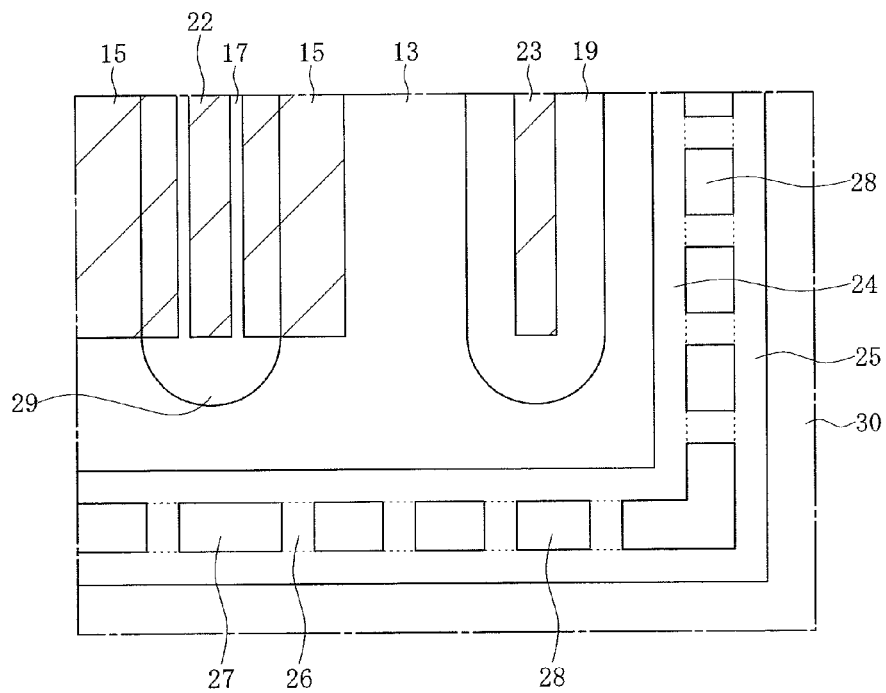
FIG. 6 is a main-part plan view showing a part of a modified example of the structure of the high withstand voltage nMOS according to the first embodiment of the present invention.

FIG. 6 is a main-part plan view for describing a modified example of the structure of a high withstand voltage nMOS according to the first embodiment.

The semiconductor layer 12 between the first annular isolation trench 24 and the second annular isolation trench 25 is separated into the source-side isolation regions 27 and the drain-side isolation regions 28 by the four linear isolation trenches 26, and the drain-side isolation regions 28 are further separated into a plurality of portions by the plurality of linear isolation trenches 26. By applying mutually different voltages to each of the plurality of separated drain-side isolation regions 28 in a stepwise manner, the electric field intensity on the drain region side can be further relaxed.

In the first embodiment, the semiconductor layer 12 having the high withstand voltage nMOS formed therein is surrounded by the double isolation trenches (the first annular isolation trench 24 and the second annular isolation trench 25), but the present invention is not limited to the double isolation trenches. It is also possible to surround the semiconductor layer 12 having the high withstand voltage nMOS formed therein by triple or more isolation trenches. In this case, since the influence on other elements of voltage noise generated by switching of the high withstand voltage nMOS can be reduced, malfunctions of other elements and the like can be prevented.

Further, in the first embodiment, the description has been made in detail for the case where the present invention is applied to the high withstand voltage nMOS, but the present invention is not limited to this and can be applied to the high withstand voltage pMOS, and also in this case, the same effect can be obtained.

As described above, the semiconductor layer 12 having the high withstand voltage MOSFET formed therein is surrounded by the first annular isolation trench 24 and the second annular isolation trench 25, and the semiconductor layer 12 between the first annular isolation trench 24 and the second annular isolation trench 25 is separated into the source-side isolation regions 27 and the drain-side isolation regions 28 by the plurality of linear isolation trenches 26, so that the source-side isolation regions 27 and the drain-side isolation regions 28 are made to have mutually different potentials. By this means, the electric field intensity of both the source region side and the drain region side can be relaxed. As a result, the p-type channel layer 17 can be reduced, and the improvement in the output current density by means of the reduction in channel resistance can be achieved. In particular, the application of the invention of the present application to the transmission circuit of the ultrasonic diagnostic device is effective because the difference between the potential of the peripheral region 30 and the potential of the source electrode 22 is large in the transmission circuit of an ultrasonic diagnostic device.

(Second Embodiment)

A structure of a high withstand voltage element according to a second embodiment of the present invention will be described with reference to a main-part plan view shown in FIG. 7. A high withstand voltage nMOS having a lateral structure is illustrated as an example of the high withstand voltage element. This high withstand voltage nMOS has the same structure as the high withstand voltage nMOS having a lateral structure described in the first embodiment except for the structures of a gate electrode and an annular isolation trench. Note that a main-part cross-sectional view taken along the line B-B' of FIG. 7 is the same as the main-part cross-sectional view shown in FIG. 4 except for the second annular isolation trench 25.

In the high withstand voltage nMOS according to the first embodiment, the semiconductor layer 12 having the high withstand voltage nMOS formed therein is surrounded by the first annular isolation trench 24 and the second annular isolation trench 25.

Figure 7:
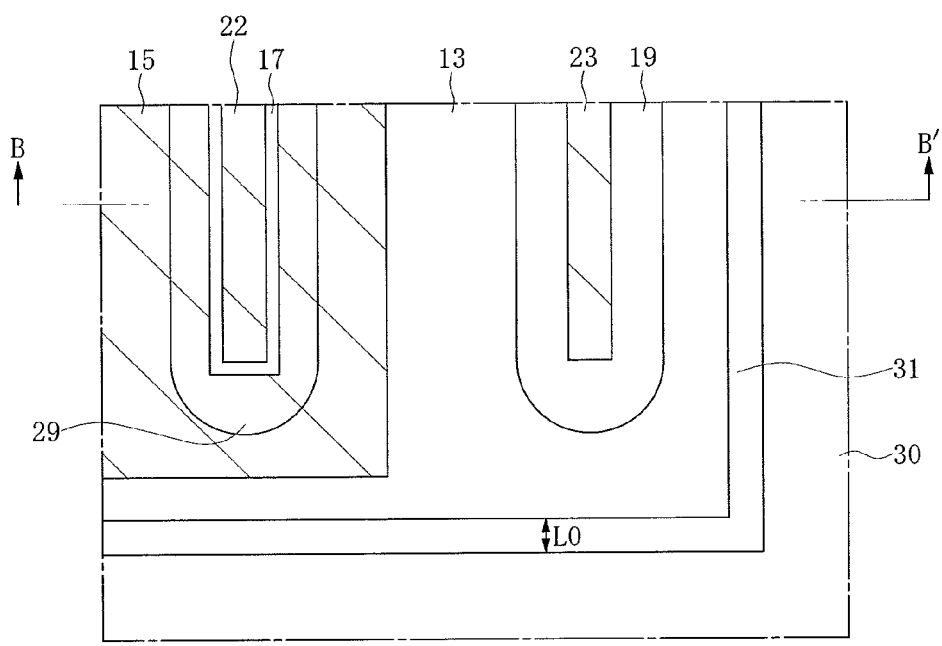
FIG. 7 is a main-part plan view showing a part of a structure of a high withstand voltage nMOS according to a second embodiment of the present invention.

However, in the high withstand voltage nMOS according to the second embodiment, as shown in FIG. 7, the semiconductor layer 12 having the high withstand voltage nMOS formed therein is surrounded by one annular isolation trench 31. The bottom of the annular isolation trench 31 reaches the buried insulating film 11 constituting an SOI substrate, and an insulating film (for example, silicon oxide film) is buried in the annular isolation trench 31. A width (L0) of the annular isolation trench 31 is, for example, 1 µm.

In the high withstand voltage nMOS according to the first embodiment, the rectangular gate electrode 15 that extends in the first direction (y direction) is formed between the source electrode 22 and the drain electrode 23.

However, in the high withstand voltage nMOS according to the second embodiment, as shown in FIG. 7, the gate electrode 15 is formed on a joint portion between the p-type channel layer 17 and the n$^-$-type drift layer 13 so as to surround the source electrode 22 with a predetermined distance when viewed in plan. More specifically, the gate electrode 15 is formed also on the p-type channel layer end portion 29.

In an off time, the gate electrode 15 has the same potential as that of the source electrode 22. By the influence of potential of the gate electrode 15 formed up to the upper side of the p-type channel layer end portion 29, the density of equipotential lines near a joint portion between the p-type channel layer end portion 29 and the n$^-$-type drift layer 13 can be reduced. As a result, the electric field intensity near the p-type channel layer end portion 29 in an off time can be relaxed.

(Third Embodiment)

A structure of a high withstand voltage element according to a third embodiment of the present invention will be described with reference to a main-part plan view shown in FIG. 8. A high withstand voltage nMOS having a lateral structure is illustrated as an example of the high withstand voltage element. This high withstand voltage nMOS has approximately the same structure as that of the high withstand voltage nMOS having a lateral structure described in the first embodiment except for the structure of the annular isolation trench, but a p-type relaxation layer 32 is provided in the semiconductor layer 12 between the p-type channel layer end portion 29 and the annular isolation trench 31. Note that a main-part cross-sectional view taken along the line C-C' of FIG. 8 is the same as the main-part cross-sectional view shown in FIG. 4 except for the second annular isolation trench 25.

In the high withstand voltage nMOS according to the first embodiment, the semiconductor layer 12 having the high withstand voltage nMOS formed therein is surrounded by the first annular isolation trench 24 and the second annular isolation trench 25.

Figure 8:
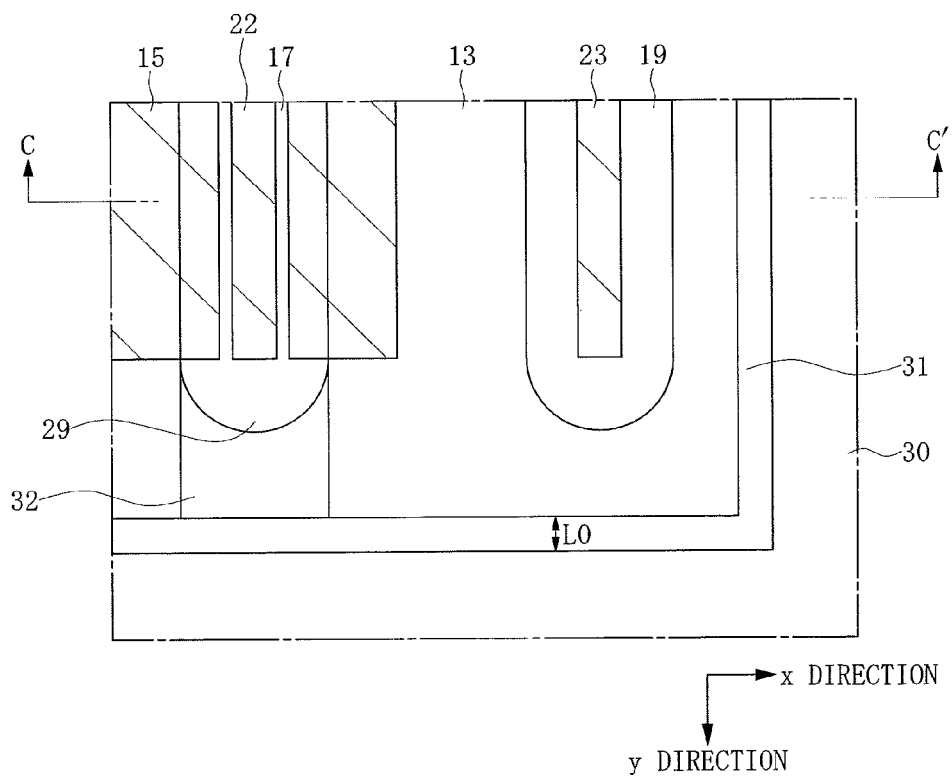
FIG. 8 is a main-part plan view showing a part of a structure of a high withstand voltage nMOS according to a third embodiment of the present invention.

However, in the high withstand voltage nMOS according to the third embodiment, as shown in FIG. 8, the semiconductor layer 12 having the high withstand voltage nMOS formed therein is surrounded by one annular isolation trench 31. The bottom of the annular isolation trench 31 reaches the buried insulating film 11 constituting an SOI substrate and an insulating film (for example, silicon oxide film) is buried in the annular isolation trench 31. A width (L0) of the annular isolation trench 31 is, for example, 1 µm.

In addition, the p-type relaxation layer 32 having impurity concentration lower than that of the p-type channel layer 17 is formed in the semiconductor layer 12 between the p-type channel layer end portion 29 and the annular isolation trench 31.

Figure 9:
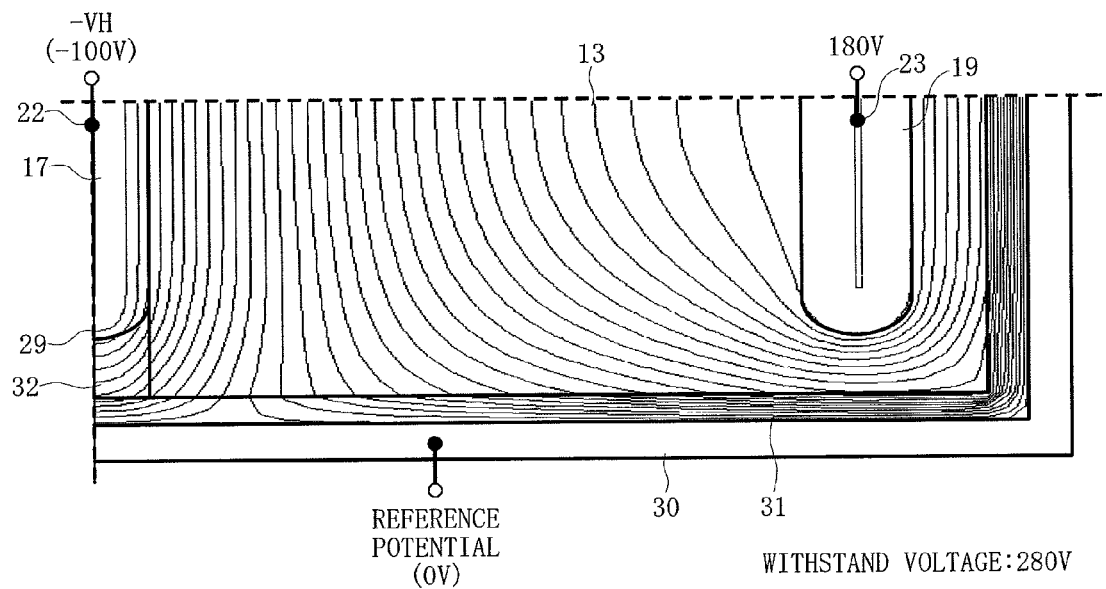
FIG. 9 is a view for describing a simulation result of an equipotential line distribution at the time of avalanche of the high withstand voltage nMOS according to the third embodiment of the present invention.

FIG. 9 shows a view for describing the simulation result of an equipotential line distribution at the time of avalanche of the high withstand voltage nMOS in which the p-type relaxation layer 32 is formed in the semiconductor layer 12 between the p-type channel layer end portion 29 and the annular isolation trench 31.

Since a depletion layer spreads toward the p-type channel layer end portion 29 from the p-type relaxation layer 32 side by providing the p-type relaxation layer 32, the density of equipotential lines near the p-type channel layer end portion 29 is decreased. Further, since the p-type relaxation layer 32 retains a certain level of voltage, the radius of curvature of the equipotential lines near the p-type channel layer end portion 29 is also increased. As a result, the electric field intensity near the p-type channel layer end portion 29 can be relaxed.

In the high withstand voltage nMOS according to the third embodiment, the semiconductor layer 12 having the high withstand voltage nMOS formed therein is surrounded by one annular isolation trench 31, but the semiconductor layer 12 having the high withstand voltage nMOS formed therein may be surrounded by the double annular isolation trenches (the first annular isolation trench 24 and the second annular isolation trench 25) like in the high withstand voltage nMOS according to the first embodiment described above. As a result, the electric field intensity near the p-type channel layer end portion 29 can be further relaxed.

Figure 10:
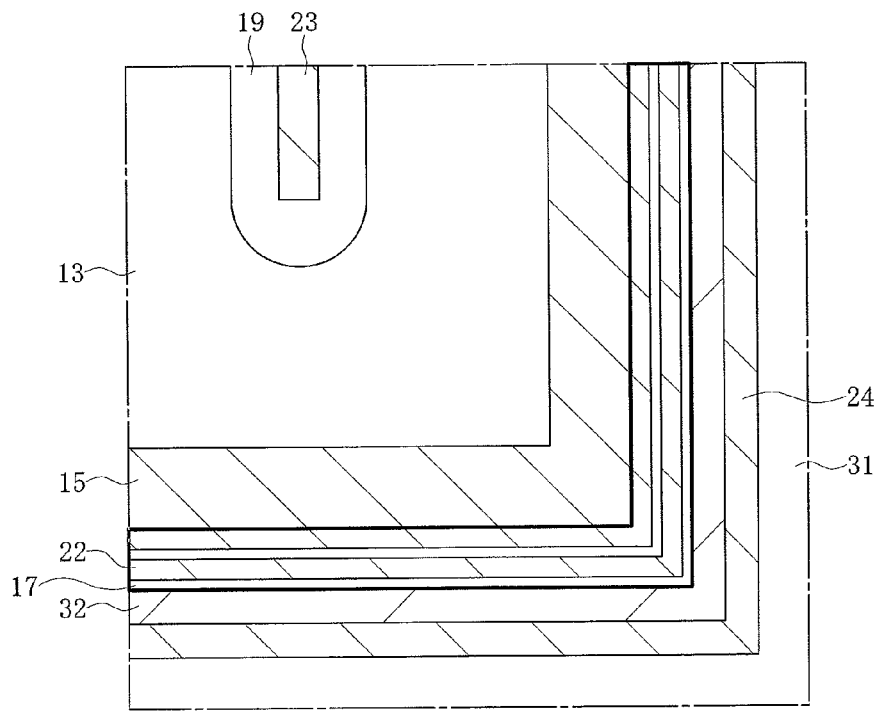
FIG. 10 is a main-part plan view showing a part of a modified example of the structure of the high withstand voltage nMOS according to the third embodiment of the present invention.

FIG. 10 shows a main-part plan view for describing a modified example of the structure of the high withstand voltage nMOS according to the third embodiment.

In the high withstand voltage nMOS shown in FIG. 8, source regions (an n-type source layer (not shown, but described in FIG. 4), the p-type channel layer 17 and the source electrode 22) and drain regions (the n-type drain layer 19 and the drain electrode 23) extend in the first direction (y direction shown in FIG. 8: channel width direction) when viewed in plan, respectively. In the high withstand voltage nMOS of a modified example, the drain regions (the n-type drain layer 19 and the drain electrode 23) extend in the first direction (y direction) when viewed in plan, but the source regions (the n-type source layer, the p-type channel layer 17, and the source electrode 22) are formed in the periphery of the drain region with a predetermined distance provided from the drain region.

More specifically, the n-type source layer and the p-type channel layer 17 formed so as to surround this n-type source layer are formed in the periphery of the drain region with a predetermined distance provided from the drain region and the annular isolation trench 31, respectively. The source electrode 22 is electrically connected to the n-type source layer and the p-type channel layer 17 so as to be formed in the periphery of the drain region, and the gate electrode 15 is also formed in the periphery of the drain region on the p-type channel layer 17 through a gate insulating film (not shown, but described in FIG. 4). Also, the p-type relaxation layer 32 is formed in the semiconductor layer 12 between the p-type channel layer 17 and the annular isolation trench 31.

In the high withstand voltage nMOS having the structure described above, since the p-type relaxation layer 32 is formed in the semiconductor layer 12 between the p-type channel layer 17 and the annular isolation trench 31, the electric field intensity of the periphery end portion of the p-type channel layer 17 can be relaxed.

(Forth Embodiment)

Figure 11:
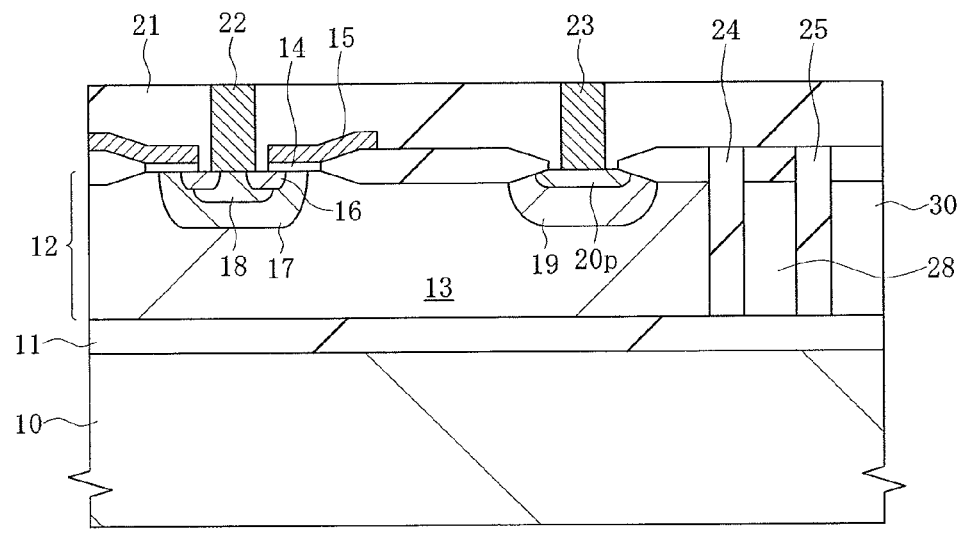
FIG. 11 is a main-part cross-sectional view showing a part of a structure of an IGBT according to a fourth embodiment of the present invention.

A structure of a high withstand voltage element according to a fourth embodiment will be described with reference to a main-part cross-sectional view shown in FIG. 11. An IGBT (Insulated Gate Bipolar Transistor) is illustrated as an example of the high withstand voltage element.

The IGBT can be realized in such a manner that the n-type contact layer 20 of the high withstand voltage nMOS (see FIGS. 3 and 4 described above) according to the first embodiment is changed to a p-type collector layer 20p, the source electrode 22 is used as an emitter electrode, and the drain electrode 23 is used as a collector electrode.

More specifically, a pnp transistor is made up by a p-type semiconductor layer composed of the p-type channel layer 17 and the p-type contact layer 18, an n-type semiconductor layer composed of the n-type drain layer 19 and the n⁻-type drift layer 13, and a p-type semiconductor layer composed of the p-type collector 20p. Furthermore, the nMOS that controls the base current is made up by the n⁻-type drift layer 13, the gate insulating film 14, the gate electrode 15, the n-type source layer 16, and the p-type channel layer 17.

The IGBT is characterized by using a conductivity modulation effect by an injection of a small number of carriers at the time of conduction, and has higher withstand voltage and is more suitable for an application of a large current as compared with a high withstand voltage MOSFET. By applying the present invention to the IGBT, the same effect as that of the high withstand voltage nMOS according to the first embodiment described above can be obtained. More specifically, the reduction in the withstand voltage of the IGBT is prevented, and the improvement in the output current density by means of the size reduction of the p-type channel layer 17 can be achieved.

(Fifth Embodiment)

Figure 12:
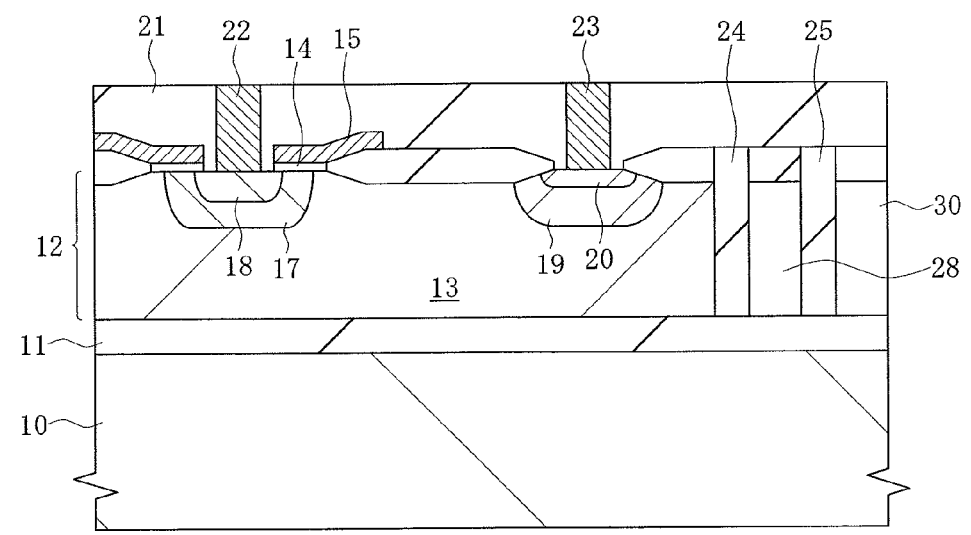
FIG. 12 is a main-part cross-sectional view showing a part of a structure of a diode according to a fifth embodiment of the present invention.

A structure of a high withstand voltage element according to a fifth embodiment will be described with reference to a main-part cross-sectional view shown in FIG. 12. A diode is illustrated as an example of the high withstand voltage element.

The diode can be realized by short-circuiting the source electrode 22 and the gate electrode 15 of the high withstand voltage nMOS according to the first embodiment (see FIGS. 3 and 4 described above) so as to use them as an anode electrode (first electrode) and by using the drain electrode 23 as a cathode electrode (second electrode).

More specifically, a p-type first semiconductor layer composed of the p-type channel layer 17 and the p-type contact layer 18 is formed, and this is used as an anode region. Similarly, an n-type second semiconductor layer composed of the n-type drain layer 19 and the n-type contact layer 20 is formed, and this second semiconductor layer and the n⁻-type drift layer 13 are used as a cathode region. In this manner, a pn junction diode can be constituted.

In the case where the diode is manufactured in the same manufacturing process as that of the high withstand voltage nMOS, when the p-type channel layer 17 of the high withstand voltage nMOS is reduced, there arises a problem of the reduction in the withstand voltage due to the influence of the periphery region also in the diode like in the high withstand voltage nMOS. However, the reduction in the withstand voltage of the diode can be prevented by applying the present invention.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to a semiconductor device having a high withstand voltage element (for example, a field-effect transistor having a lateral structure, an IGBT, and a diode).

What is claimed is:

1. A semiconductor integrated circuit having a field-effect transistor, the semiconductor integrated circuit comprising:
    an SOI substrate made up of a supporting substrate, a buried insulating film formed on the supporting substrate, and a semiconductor layer of a first conductivity type formed on the buried insulating film;
    a first annular isolation trench formed in a periphery of an element region of the semiconductor layer;

a second annular isolation trench formed around the first annular isolation trench with a predetermined distance provided from the first annular isolation trench;

a source layer of the first conductivity type formed on a main surface of the semiconductor layer of the element region so as to extend in a first direction;

a channel layer of a second conductivity type different from the first conductivity type formed in the semiconductor layer so as to surround the source layer;

a source electrode electrically connected to the source layer and the channel layer;

a drain layer of the first conductivity type formed on the main surface of the semiconductor layer of the element region so as to extend in the first direction with a predetermined distance provided from the source layer in a second direction orthogonal to the first direction;

a drain electrode electrically connected to the drain layer;

a gate insulating film formed on the channel layer between the source layer and the drain layer; and a gate electrode formed on the gate insulating film, wherein the semiconductor layer between the first annular isolation trench and the second annular isolation trench is separated into a plurality of portions by a plurality of linear isolation trenches formed in the semiconductor layer between the first annular isolation trench and the second annular isolation trench, and wherein the semiconductor layer which opposes an end portion of the channel layer in the first direction and is located between the first annular isolation trench and the second annular isolation trench is separated from other semiconductor layers between the first annular isolation trench and the second annular isolation trench by the linear isolation trenches.

2. The semiconductor integrated circuit according to claim 1, wherein bottoms of the first annular isolation trench, the second annular isolation trench, and the linear isolation trench reach the buried insulating film, and insulating films are buried in the first annular isolation trench, the second annular isolation trench, and the linear isolation trench.

3. The semiconductor integrated circuit according to claim 1, wherein widths of the first annular isolation trench, the second annular isolation trench, and the linear isolation trench are 1 μm.

4. The semiconductor integrated circuit according to claim 1, wherein a reference potential is applied to the semiconductor layer outside the second annular isolation trench, and a potential different from the reference potential is applied to the source electrode.

5. The semiconductor integrated circuit according to claim 1, wherein the semiconductor layer which opposes the end portion of the channel layer in the first direction and is located between the first annular isolation trench and the second annular isolation trench is electrically connected to the source electrode.

6. The semiconductor integrated circuit according to claim 1, wherein the semiconductor layer between the first annular isolation trench and the second annular isolation trench other than the semiconductor layer which opposes the end portion of the channel layer in the first direction and is located between the first annular isolation trench and the second annular isolation trench is electrically connected to the drain electrode.

7. The semiconductor integrated circuit according to claim 1, wherein the field-effect transistor is used for a signal circuit of an ultrasonic diagnostic device.

* * * * *